United States Patent
Virkar et al.

(10) Patent No.: US 8,119,445 B2
(45) Date of Patent: Feb. 21, 2012

(54) ORGANIC SEMICONDUCTORS AND GROWTH APPROACHES THEREFOR

(75) Inventors: Ajay A. Virkar, Stanford, CA (US); Stefan Christian Bernhardt Mannsfeld, Palo Alto, CA (US); Zhenan Bao, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 352 days.

(21) Appl. No.: 12/127,323

(22) Filed: May 27, 2008

(65) Prior Publication Data

US 2009/0294760 A1 Dec. 3, 2009

(51) Int. Cl.
*H01L 21/44* (2006.01)
(52) U.S. Cl. .............. 438/99; 257/40; 257/E51.024; 257/E51.038
(58) Field of Classification Search .............. 257/40, 257/E51.006, E51.024, E51.038; 438/99
See application file for complete search history.

(56) References Cited

U.S. PATENT DOCUMENTS

| | | | |
|---|---|---|---|
| 4,539,061 A | 9/1985 | Sagiv | |
| 7,298,013 B2 | 11/2007 | Schmid et al. | |
| 7,306,969 B2 * | 12/2007 | Wu et al. | 438/99 |
| 7,326,957 B2 | 2/2008 | Halik et al. | |
| 7,329,319 B2 * | 2/2008 | Myerson et al. | 117/68 |
| 2003/0175551 A1 | 9/2003 | Smith et al. | |
| 2006/0057851 A1 * | 3/2006 | Wong et al. | 438/694 |
| 2006/0076556 A1 * | 4/2006 | Hobara et al. | 257/40 |
| 2009/0155964 A1 * | 6/2009 | Chang et al. | 438/197 |
| 2009/0297868 A1 | 12/2009 | Ito et al. | |

* cited by examiner

*Primary Examiner* — Matthew Landau
*Assistant Examiner* — Colleen E Snow
(74) *Attorney, Agent, or Firm* — Crawford Maunu PLLC

(57) ABSTRACT

Organic semiconductor devices exhibit desirable mobility characteristics. In connection with various example embodiments, a monolayer of methyl-terminated molecules exhibits density characteristics that are sufficient to promote two-dimensional growth of organic semiconductor material formed thereupon. In some applications, the methyl-terminated molecules are sufficiently dense to dominate inter-layer interactions between layers of the organic semiconductor material.

23 Claims, 5 Drawing Sheets

| Sample | Deposition Method | Surface Pressure (mN/m) | Mean Molecular Area ($A^2$/Molecule) | Height (nm.) | Water Contact Angle (deg) | AFM RMS Roughness (nm) |
|---|---|---|---|---|---|---|
| 1. OTMS | LB | 20 | 24.8 | 2.02 | 101.7 | .24 |
| 2. OTMS | LB | 35 | 22.5 | 2.11 | 102.6 | .27 |
| 3. OTMS | LB | 50 | 20.1 | 2.13 | 104.1 | .22 |
| 4. OTMS | Vapor Phase | NA | 32.6 | 1.85 | 90.5 | .28 |
| 5. OTCS | Vapor Phase | NA | 28.7 | 1.88 | 98.3 | .17 |
| 6. $SiO_2$ | NA | NA | NA | NA | Wets | .41 |

FIG. 3

ORGANIC SEMICONDUCTORS AND GROWTH APPROACHES THEREFOR

FEDERALLY-SPONSORED RESEARCH OR DEVELOPMENT

This invention was made with Government support under contract 0507296 awarded by the National Science Foundation. The Government has certain rights in this invention.

FIELD OF THE INVENTION

The present invention relates generally to organic semiconductors, to their uses and manufacture.

BACKGROUND

Organic semiconductors continue to show promise for a variety of applications, and have been the subject of consideration for use in many low-cost, large area electronic applications. As an example, organic thin-film transistors (OTFTs) are a relatively viable alternative to more traditional, mainstream thin-film transistors (TFTs) based on inorganic materials. For organic field-effect transistors (OFETs) and other organic semiconductor devices, an important figure of merit is the charge carrier mobility $\mu$, which is a measure of how fast charge carriers move through a semiconductor under an applied electrical field.

To suit these applications, various highly-conjugated small molecule and polymeric organic semiconductors are being researched as candidates for a variety of next generation electronic devices. However, organic semiconductor layers often exhibit relatively low mobility and, correspondingly, relatively low performance characteristics in comparison to field-effect transistors using single-crystalline inorganic semiconductors such as Silicon and Germanium and exhibiting much higher charge carrier mobilities ($\mu$). Consequently, many electronic applications such as those requiring very high switching speeds have not typically used OTFTs.

Prior efforts to increase semiconductor mobilities and improve other processing characteristics have involved the use of some sort of passivation at the interface between dielectric layers and organic semiconductor material formed thereupon. However, these techniques have been challenging to efficiently and reproducibly implement in the manufacture of organic semiconductor devices. For instance, boundaries between crystalline grains are barriers to charge transport that can greatly reduce performance.

These and other issues have been challenging to the design, manufacture and implementation of semiconductor devices, and in particular, for those semiconductor devices employing organic semiconductor materials.

SUMMARY

The present invention is directed to the formation of lateral or two-dimensional organic semiconductor layers in a manner that addresses challenges including those mentioned above. These and other aspects of the present invention are exemplified in a number of implementations and applications, some of which are shown in the figures and characterized in the claims section that follows.

According to an example embodiment, a monolayer of methyl-terminated molecules is formed on a dielectric material and used to promote the two-dimensional growth of an organic semiconductor material formed thereupon. The density of methyl-terminated molecules in the monolayer is set sufficiently high to provide interactions with the subsequently-formed organic semiconductor material that promote and/or control the two-dimensional growth. The density of methyl-terminated molecules in the monolayer is set, for example, using pressure or other manufacturing conditions. With these approaches, resulting organic semiconductor materials exhibit relatively high mobility characteristics that are desirable for a multitude of semiconductor applications.

According to another example embodiment of the present invention, a semiconductor device is manufactured having a dielectric layer, a self-assembled monolayer (SAM) on the dielectric layer and layers of organic semiconductor material on the SAM. The SAM is formed having a density of methyl-terminated molecules that is sufficient to dominate inter-layer interactions between layers of organic semiconductor material formed thereupon. The layers of organic semiconductor material are formed using the interaction energy between the methyl-terminated molecules and a first one of the layers to dominate inter-layer interaction energy between the first layer and another one of the layers, for controlling the formation of at least the first one of the layers as a two-dimensional layer.

According to another example embodiment of the present invention, an organic thin-film transistor device includes a channel region having layers of two-dimensional organic semiconductor material that pass a predominant amount of current passed in the transistor. The device includes a gate, a dielectric layer on the gate, and a self-assembled monolayer (SAM) on the dielectric layer to promote growth of the two-dimensional organic semiconductor material. The SAM has a density of methyl-terminated molecules that is sufficient to promote two-dimensional crystalline growth of the organic semiconductor material upon the monolayer (e.g., near a dielectric/semiconductor material interface at which current flows). The channel region has a first layer of two-dimensional crystalline organic semiconductor material directly on the SAM and a second layer of two-dimensional crystalline organic semiconductor material directly on the first layer. The interaction energy between the SAM and the first layer is greater than the inter-layer interaction energy between the first and second layers to promote said two-dimensional growth. Source and drain regions are formed on the organic semiconductor material and electrically coupled via the channel region.

The above summary is not intended to describe each illustrated embodiment or every implementation of the present invention.

BRIEF DESCRIPTION OF THE DRAWINGS

The invention may be more completely understood in consideration of the detailed description of various embodiments of the invention that follows in connection with the accompanying drawings in which:

FIG. 3 is a table showing conditions used with different approaches to growing two-dimensional organic semiconductor material, according to various example embodiments of the present invention.

Figure 1A:
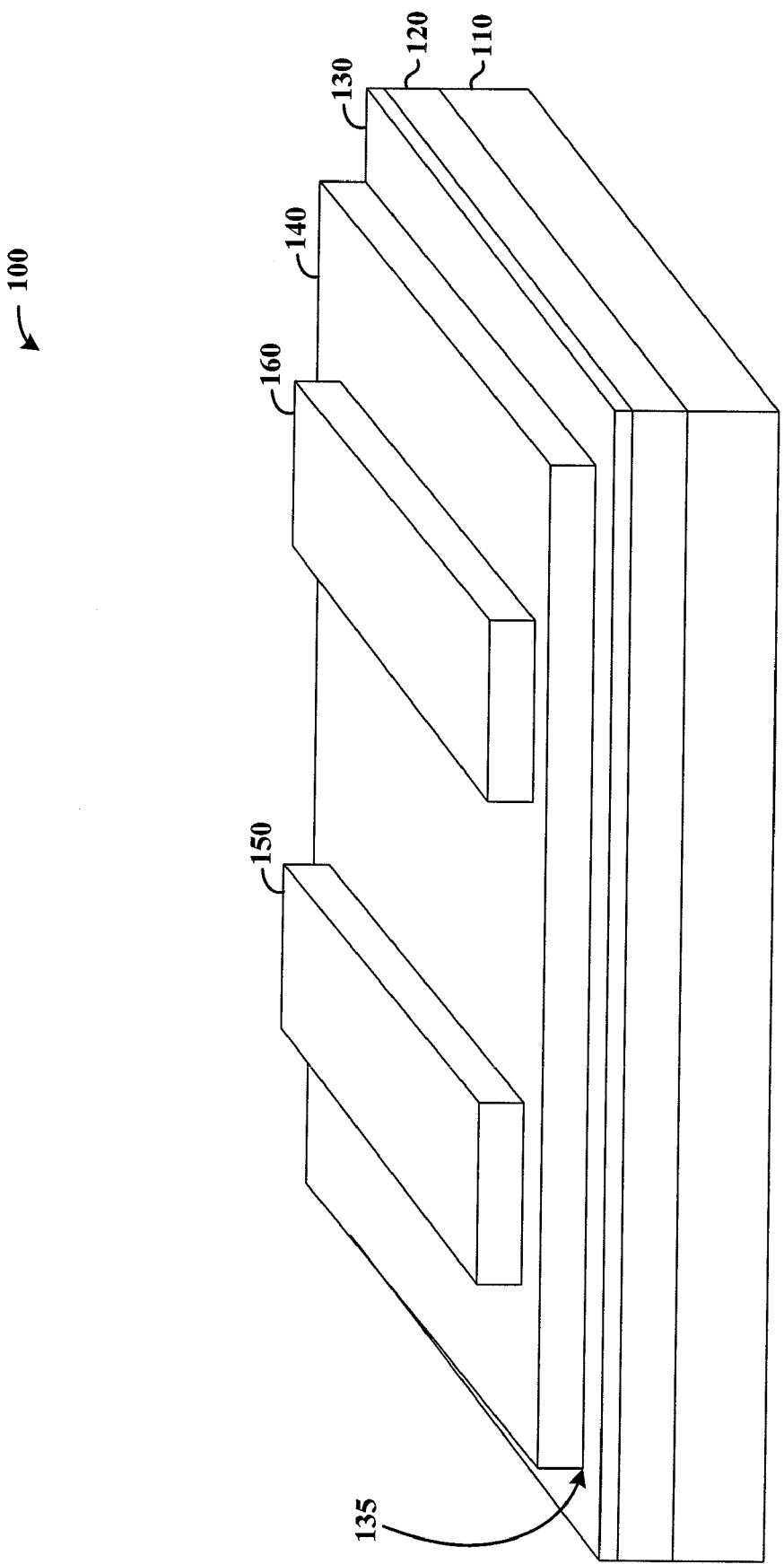
FIG. 1A shows an organic semiconductor device, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is directed to organic semiconductors, their uses and their manufacture, as well as related types of materials, devices, methods of manufacture and approaches for the same. These and other aspects of the present invention are exemplified in a number of illustrated implementations and applications, some of which are shown and characterized in the following description and related figures, and further in the claims section that follows.

According to an example embodiment of the present invention, a monolayer of methyl-terminated molecules is used to control or otherwise promote two-dimensional growth of an organic semiconductor material. The density and/or related ordering of methyl-terminated molecules is sufficient to facilitate relatively strong interactions (i.e., interaction energy) between the molecules and organic semiconductor material grown thereupon. These strong interactions promote two-dimensional growth of a layer of the organic semiconductor material formed on and contacting the molecules by controlling, or dominating, interactions between this contacting layer and any subsequent layers that are formed on or over the contacting layer.

In terms of energy, the monolayer is arranged such that the interaction between the monolayer and a two-dimensional layer formed thereupon is greater than the interaction between the two-dimensional layer and subsequently-formed layers. By providing a high-density monolayer, a relatively large number of methyl-terminated molecules are made available for contacting a given surface area of subsequently-grown organic semiconductor material.

Accordingly, the arrangement of the monolayer is used to promote subsequent two-dimensional organic semiconductor growth. A small increase in the density and/or the order of methyl-terminated molecules greatly affects growth dynamics, and consequently charge transport, in devices formed using this approach. The phase of the monolayer is also used to promote desirable two-dimensional growth, and is applicable in conditions where roughness and surface energy are very similar, and chemical structure is identical.

In many applications, methyl-terminated molecules having an even number of carbons are used to promote desirable interactions with organic semiconductor material as relative, for example, to related packing and/or density characteristics of the monolayer. In connection with these embodiments, it has been discovered that molecules having an even number of carbons can be used to promote two-dimensional growth of organic semiconductor material, which may not be possible with molecules having an odd number of carbons.

According to another example embodiment of the present invention, a capacitive device includes a conductive control port (e.g., a gate) adjacent a dielectric material, an organic semiconducting channel and a monolayer of methyl-terminated molecules at an interface between the dielectric material and the channel. The organic semiconducting channel includes a two-dimensional layer of organic semiconductor material that is in contact with the monolayer. Methyl-terminated molecules in the two-dimensional layer dominate interactions between the organic semiconductor molecules (e.g., as deposited and/or as related to inter-layer interactions between the two-dimensional layer and additional layers of the organic semiconductor material). This domination (e.g., as described above) promotes two-dimensional growth of the organic semiconductor, which exhibits desirable mobility characteristics suitable for a variety of semiconductor applications.

Monolayers of methyl-terminated molecules are manufactured or otherwise provided using one or more of a variety of approaches. In some applications, methyl-terminated molecules are sufficiently compressed to achieve molecular density characteristics (e.g., in a crystalline phase) that facilitate the two-dimensional growth. This compression involves, for example, pressurizing a deposition chamber with methyl-terminated molecules to a pressure known or determined to promote the formation of a monolayer upon which subsequent two-dimensional semiconductor growth can be carried out as described above. For instance, a monolayer formed using an insufficient amount of compression (and/or density) would not yield two-dimensional growth thereupon. As relative to the above discussion of interaction energy, a monolayer formed using an insufficient amount of compression (or density) may accordingly exhibit a interaction energy, relative to a first two-dimensional layer formed on the monolayer, that is less than interaction energies between molecules in the first layer and other molecules such as those in a subsequently-formed layer. Desirable interaction may, for example, be characterized as an energy that is at least about 0.12 (eV) for (pentacene for example under typical fabrication conditions) certain applications, and at least about 0.075 (eV) for other applications. In this regard, sufficient compression and/or resulting density, is that which promotes two-dimensional growth of organic semiconductor material, and monolayer domination of organic semiconductor interactions.

Other approaches to monolayer formation involve ordering the monolayer to facilitate a desired density of methyl-terminated molecules. For instance, where the monolayer is formed in a crystalline arrangement, the order of the arrangement can affect the packing of the molecules, which in turn affects the number of molecules available for contacting a given surface area of an organic semiconductor material formed on the monolayer. Molecules in the monolayer may be ordered using pressure as described above, or using other approaches such as those involving temperature, magnetic, electrical, chemical, molecular or other interactive processing conditions that promote desirable ordering.

In connection with various example embodiments, the formation of a two-dimensional layer of organic semiconductor material includes forming a layer along the surface of an underlying monolayer such as described above. The resulting two-dimensional layer may exhibit varying degrees of crystallization, with the crystalline structure extending laterally along the underlying surface. In these contexts, the term two-dimensional may relate to a layer that has a thickness that is substantially about the thickness of one molecule of the organic semiconductor material, and/or to a layer that exhibits two-dimensional crystallization (relative, for example, to three-dimensional crystallization). As the two-dimensional layer is formed, it grows or otherwise forms in a generally lateral direction along the underlying surface.

A variety of approaches are used to form layered structures in accordance with one or more example embodiments. In one embodiment, a solution is prepared of 2-5 mM trichloroethylene of terminal silane (—SiR3, R=Cl, OMe, OEt) compounds whose molecular length is more than 10 angstroms. The solution is dropped on a substrate having a silicon oxide dielectric layer that has been cleaned (e.g., by a piranha solution and UV/ozone treatment). The substrate is spun at 1000-5000 rpm for drying, and the substrate is exposed to ammonia or hydrochloric acid in a closed container. The obtained wafer with monolayers can be rinsed or sonicated with solvents such as Trichloroethylene, Chlorobenzene or bromobenzene.

Turning now to the figures, FIG. 1A shows an organic semiconductor device 100, according to another example embodiment of the present invention. The device includes a gate-type structure 110 on which a dielectric material 120 is located to provide capacitive coupling of a voltage applied at the gate-type structure. A self-assembled monolayer (SAM) 130 on the dielectric material 120 includes methyl-terminated molecules such as organosilane that provide an interface 135 with subsequently-formed organic semiconductor material 140 that facilitates two-dimensional growth of the organic semiconductor material at the interface. Source and drain conductors 150 and 160 are arranged on the organic semiconductor material 140. The arrangement 100 passes current between the source and drain 150 and 160, in response to a voltage applied at the gate-type structure 110, with desirable mobility characteristics pertinent to the two-dimensional organic semiconductor material near the interface 135.

Generally, the density of molecules in the SAM 130 is sufficient to promote two-dimensional growth of the organic semiconductor material 140 at the interface 135, which provides desirable mobility characteristics as discussed above. That is, charge transport in the organic semiconductor material 140 generally occurs in the first few layers nearest the interface 135, and thus the growth and arrangement of the organic semiconductor material 140 at this interface sets the performance characteristics of a device formed therewith. A high density of methyl-terminated molecules in the SAM 130 ensures that a large number of the molecules are available for interacting with the organic semiconductor material 140. This interaction dominates, as described above, semiconductor-semiconductor interactions with the organic semiconductor material, thus promoting two-dimensional growth at the interface 135 and setting desirable performance characteristics of the resulting device 100.

Materials used to form the device 100, and implementations of the resulting device vary according to the particular application, performance characteristics and available materials. The dielectric material 120 may include one or more of Silicon Oxide, Aluminum Oxide, Titanium Oxide, Zirconium Oxide, Indium Tin Oxide, Tin Oxide, Silicon, Aluminum, Titanium, Zirconium or dielectric materials deposited on flexible plastic films. The monolayer 130 may include one or more of a variety of methyl-terminated molecules such as octadecyltrichlorosilane (OTS), Thiol, phosphoric acid, alkyl groups, conjugated rings (benzene, thiophene, pyridine, pyrrol, fluorene, acenes), olefins, acetylenes, or polymers having methyl groups. In many applications, the methyl-terminated molecules have an even number of carbons, which promotes desirable density and/or packing characteristics. In addition, the capacitive structures as shown are applicable to use in connection with a variety of devices, such as field-effect transistors, electroluminescent devices, sensors and memories, and further as templates for crystal growth that may include the growth of non-semiconducting materials.

Figure 1B:
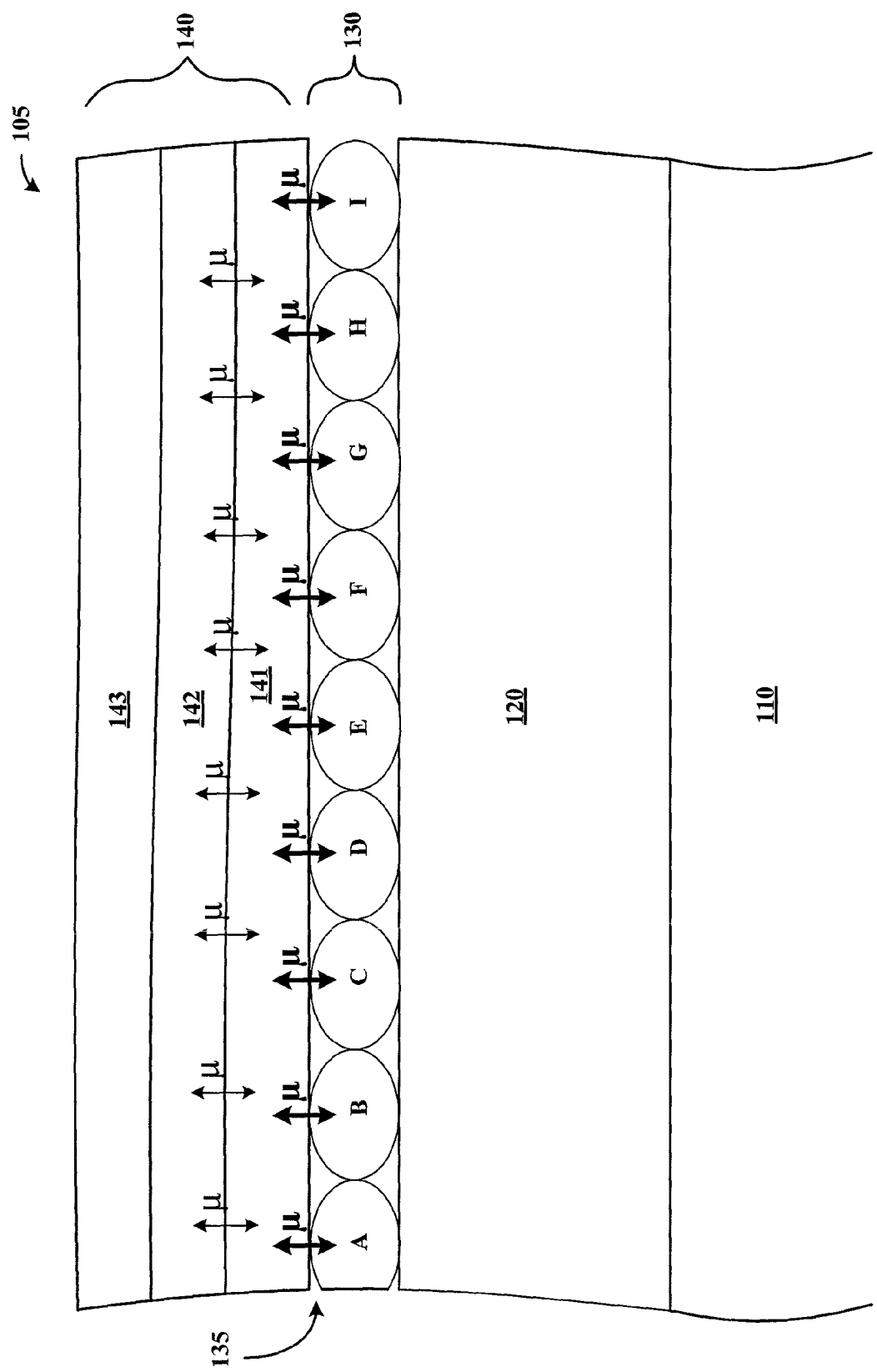
FIG. 1B shows a cross-sectional view of an organic semiconductor device and an interface between a self-assembled monolayer and a two-dimensional organic semiconductor material, according to another example embodiment of the present invention.

FIG. 1B shows a cross-sectional view 105 of an organic semiconductor device and an interface 135 between a self-assembled monolayer (SAM) 130 and a two-dimensional organic semiconductor material 140, according to another example embodiment of the present invention. By way of example, FIG. 1B is shown and described relative to the organic semiconductor device 100, with labels corresponding to the same. However, the arrangement at the interface 135 and respective adjacent layers is applicable to implementation with a variety of capacitive structures such as insulated-gate field-effect transistors (IGFETs), insulated-gate thyristors, discrete capacitors and other organic field-effect transistors (OFETs).

Individual molecules A-I interact with a first organic semiconductor layer 141 of the organic semiconductor material 140, with the interaction energy between the individual molecules and molecules in the first layer being greater than interaction energy between molecules in the first layer and in subsequent layers 142 and 143 (or more layers as applicable, some of which may be two-dimensional). This domination of interactions with the first organic semiconductor layer 141 by the molecules A-I in the SAM 130 is visually represented by arrows in FIG. 1B. Arrows representing interactions between the SAM 130 and the first layer 141 are shown larger and heavier than arrows representing inter-layer interactions with the first layer 141.

In various applications, the density of molecules in the monolayers used in connection with various embodiments relates to one or both of the phase and order of the molecules. For instance, referring to FIG. 1B by way of example, the phase and order (e.g., crystallinity) of the molecules A-I can impact their interaction with subsequently-formed organic semiconductor material such as pentacene (and other n-channel) transistors. Generally, the organic semiconductor growth may thus be relatively more significant in terms of mobility than crystallinity.

Two-dimensional layer-by-layer growth with layer 141, 142, 143 (and perhaps additional layers) is desirable for various applications since three-dimensional (3D) growth can lead to grain boundaries that can limit current flow during coalescence. These first few monolayers (e.g., 2-6) near the interface 135 carry out most charge transport for the device 105.

As relevant to the above and other example embodiments of the present invention, self-assembled monolayers (SAMs) may consist of a single layer of molecules formed on an underlying monolayer of methyl-terminated molecules as described above. These SAMs can be prepared by adding a solution of a desired organic semiconductor molecule to the underlying monolayer. Excess solution is washed off.

Figure 2:
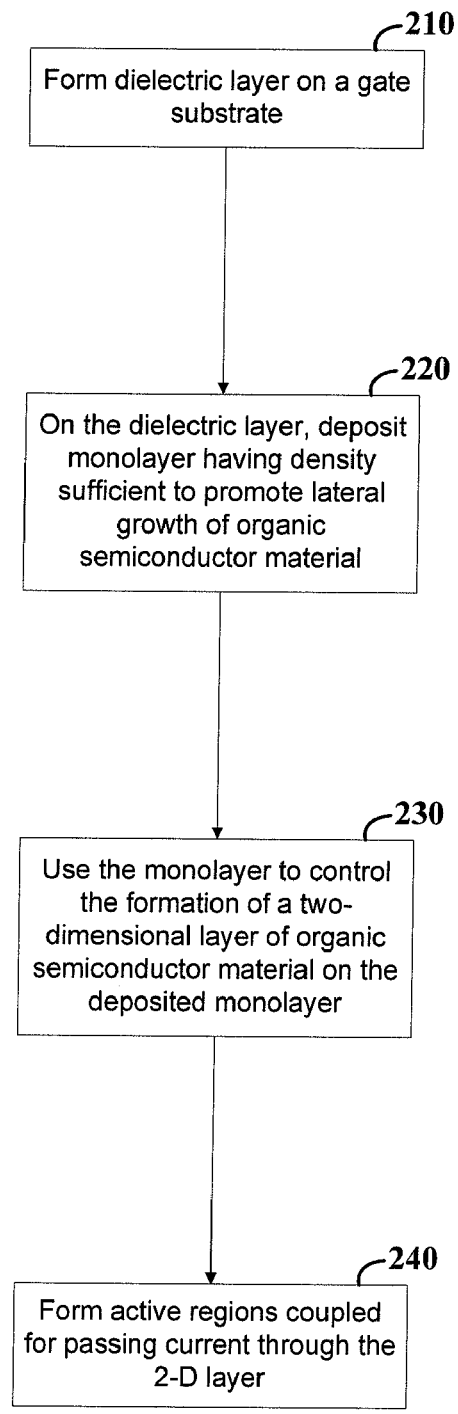
FIG. 2 is a flow diagram for an approach to manufacturing an organic semiconductor device, according to another example embodiment of the present invention.

FIG. 2 is a flow diagram for an approach to manufacturing an organic semiconductor device, according to another example embodiment of the present invention. At block 210, a dielectric layer is formed on a gate substrate. At block 220, a monolayer of methyl-terminated molecules is formed on the dielectric layer, with the density of methyl-terminated molecules in the monolayer controlled for promoting lateral growth of organic semiconductor material thereupon.

The monolayer formed at block 220 is used to control the formation of a two-dimensional layer of organic semiconductor material on the monolayer at block 230. Generally, the methyl-terminated molecules, at the above-described controlled density, are used to dominate interactions with organic semiconductor material as the organic semiconductor material is crystallized. In one implementation, a vapor-phase organic semiconductor material is introduced to the monolayer and begins to crystallize and form several layers. Interactions between the monolayer and a first of the crystallizing layers dominate interactions with the crystallizing material to produce a two-dimensional layer of organic semiconductor material.

Once the organic semiconductor material has been formed at block 230, additional steps are carried out to implement the material and the related capacitive structures formed at block 210 into workable devices. In this context, at block 240, an example implementation of the capacitive structures with an organic field-effect transistor (OFET) is carried out by forming active regions on the organic semiconductor material for passing current through the two-dimensional layer.

As described above, these approaches can be implemented with a multitude of insulated gate-type devices or capacitive devices, and as such, further steps in addition to and/or as an alternative to those at block 240 are carried out in connection with other example embodiments. These steps may involve further connecting the capacitive structure in a circuit, such as by electrically connecting the active regions. Where an array of devices is needed, the above steps are carried out on a larger scale to form an array of devices, with the gate substrate including one or more gates for selectively coupling to different devices formed thereupon. For example, complementary circuits can be formed having n-channel (electron transporting) OFETs using an organic semiconductor material such as N,N-bis(2,2,3,3,4,4,4-heptafluorobutyl)-perylene tetracarboxylic diimide (PTCDI-C4F7), which exhibits a dense and well-stacked parallel arrangement of PTCDI planes π-planes, leading to high charge carrier transport.

The approaches shown in FIG. 2 may be carried out using one or more of a variety of operating conditions. The following example describes one such application. The monolayer is formed at block 220 using a Langmuir-Blodgett (LB) technique to compress ampiphilic molecules at the air-water interface to induce phase transitions and ordering by applying lateral pressure to the monolayer film and decreasing the available trough area. These thermodynamic phases changes, which are the two-dimensional analogs of three-dimensional phase transitions, can give rise to a two-dimensional gas, liquid or solid monolayer. In some applications, film collapse occurs at a surface pressure of about 55 mN/m, and the monolayer is formed under pressure conditions meeting or exceeding this pressure. The monolayers are Blodgett-transferred to the dielectric surface, which is formed at block 210 as 300 nm silicon oxide thermally grown upon wafers having a heavily doped silicon back gate electrode. Pentacene is deposited as the organic semiconductor material at block 230 under vacuum (e.g., about $10^{-7}$ Torr) at a substrate temperature of about 60° C. Transistors are completed at block 240 by thermal deposition of gold through a shadow mask (W/L=20, L=50 um).

The monolayers as described above in connection with FIG. 2 and otherwise are formed using different approaches as may be applicable to various example embodiments. In some applications, a self-assembled monolayer (SAM) is deposited from solution or by chemical vapor deposition (CVD) at elevated temperatures and reduced pressures, and self assembles on a dielectric surface. The SAM interacts with subsequently-formed organic semiconductor material in a manner controlled by its arrangement (i.e., density, order and/or phase characteristics). In some applications, the monolayers are polymerized on trough with methanol as a volatile leaving group to promote close-packed films.

In some applications, the approach carried out at block 220 involves spin-coating the monolayer. This technique employs a nonpolar solvent to drive the assembly of amphilic organosilane during spin coating. Firstly, a 3-4 mM solution of OTMS or OTCS is created in nonpolar solvent (such as trichloroethylene, toluene, or chloroform). The solution is then allowed 10 seconds to partially assemble on a hydrophilic $SiO_2$ surface (e.g., as formed at block 210). The solution and substrate are then spun at 3000 RPM for 10 seconds. During spin-coating, much of the excess fluid is removed and the hydrophilic silane head group interacts with the surface and neighboring molecules, partially polymerizing and attaching to the surface. Following spin coating, the substrates are placed in a small closed container that contains a small vial of acid (HCl) or base ($NH_4OH$). As the acid (or base) vaporizes and interacts with the surfaces, it catalyzes polymerization and the monolayers form a closed-packed film. The substrate is held in the closed container for approximately 10 hours, after which it is washed with a serious of solvents. The resulting monolayer crystallizes with a 4.2 A° hexagonal lattice constant and it shows similar roughness, density, and surface energy to transferred 50 mN/m films.

FIG. 3 is a table showing conditions used with different approaches to growing two-dimensional organic semiconductor material, according to various example embodiments of the present invention. These approaches include using a Langmuir-Blodgett (LB) approach and a vapor deposition (i.e., CVD) approach. The table shows the effect of both density and degree of ordering of octadecyltrimethoxysilane (OTMS) monolayers upon the formation of pentacene (organic semiconductor) for uses in devices such as organic field effect transistors OFETs. The pentacene mobility (for about 40 devices) is shown as a function of SAM density. As the films become more compressed, the characteristic aliphatic vibrational stretching modes shift to lower wavenumbers (e.g., about 2851 and 2820) indicating phase transitions from liquid-like to crystalline. The density and order of the films as functions of compression is further asserted by ellipsometry, static water contact angle and AFM data presented in FIG. 3. As the monolayers are compressed, the height, and water contact angle increase, indicating better ordered and denser monolayers. The films also exhibit an overall domain size that is roughly 30% larger than vapor phase films.

As represented in FIG. 3, the RMS roughness is very similar for the LB films and the OTCS-CVD film, with the OTCS-CVD being the smoothest. This indicates that the differences in charge carrier mobility are not due to surface roughness effects. Upon heating to about 200° C. under argon and or nitrogen, the FTIR spectrum, contact angle and AFM remained nearly identical for the films, indicating that the films do not undergo further thermal phase changes in the temperature ranges used for semiconductor deposition. The pentacene charge carrier mobility ($\mu$) extracted from transfer characteristics increases systematically with underlying OTMS order from 0.4 $cm^2$/Vs for the least compressed LB film to 1.9 $cm^2$/Vs on the most highly ordered monolayer film. As the SAM undergoes phase transitions from liquid-like to crystalline, the mobility increases by a factor of 5, despite only modest differences in surface energy and roughness; the phase of the OTMS is accordingly controlled to promote desirable performance. In various implementations, the density of the OTMS is controlled to a molecular area of ~20.1 $A^2$/molecule, to facilitate desirable two-dimensional growth of pentacene thereupon.

EXPERIMENTAL EMBODIMENTS

The following discussion characterizes various approaches that may be implemented in connection with one or more example embodiments of the present invention. In this context, the embodiments described may be implemented in connection with one or more of the above embodiments, the claims and the approaches shown in the figures.

In order to elucidate the effect of the monolayers on the semiconductor at the dielectric interface 3 nm Pentacene, thin films are deposited under identical conditions as OFET fabrication on the various substrates. As aforementioned, nearly all charge transport occurs in the first few semiconductor monolayers at the dielectric interface which is why this region is chosen for investigation of pentacene and organosilane crystallinity using grazing incidence X-ray diffraction (GIXD) and morphology using atomic force microscopy (AFM). From the GIXD spectrum of the 3 nm film, quantitative information about the crystallinity of interfacial pentacene grains directly involved in transport can be obtained, which is more pertinent than out of plane diffraction information commonly used to characterize organic semiconductor thin films. The thin film GIXD spectrum shows characteristic diffraction ((11), (02) and (12)) in-plane diffraction peaks for pentacene on the different monolayers. On the LB (50 mN/m) film there is an additional broad peak between the (11) and (02) pentacene peaks. This peak is due to the crystallization of the underlying OTMS. The calculated hexagonal lattice constant of 4.2 Angstrom is consistent with literature. This additional OTMS crystallization peak is seen in the OTMS LB (50 mN/m).

In order to confirm that the extra peak originates from the crystalline OTMS film, further GIXD experiments are performed on the OTMS and OTCS monolayer samples (with no pentacene deposited). In the resulting diffractograms, the same broad peak was for the observed only on the most densely packed film LB (50 mN/m), proving the highly ordered underlying SAM crystallizes. From the estimated molecular density extracted from the Langmuir trough, it is evident that there is a phase transition between the 35 mN/m film and 50 mN/m film, indicating that at a molecular area of about 20.1 $A^2$/molecule, the OTMS crystallizes.

The lattice constants for pentacene extracted from diffraction peaks are nearly identical regardless of substrate (a=5.93 A°; b=7.58 A°; γ=90 deg) and are consistent with reports of pentacene grown on HMDS and OTS. However, the crystallinity of the pentacene is different on the various surfaces. Using the Debye-Scherrer formula, the coherence length (CL) can be approximated from the full width-half-max of the pentacene diffraction peaks using CL=1.8 π/FWHM. The coherence length is approximately the distance over which a certain spatial phase relationship exists in a (distorted or polycrystalline) lattice. Thus, a larger coherence length may be indicative of greater crystallinity.

Figure 4:
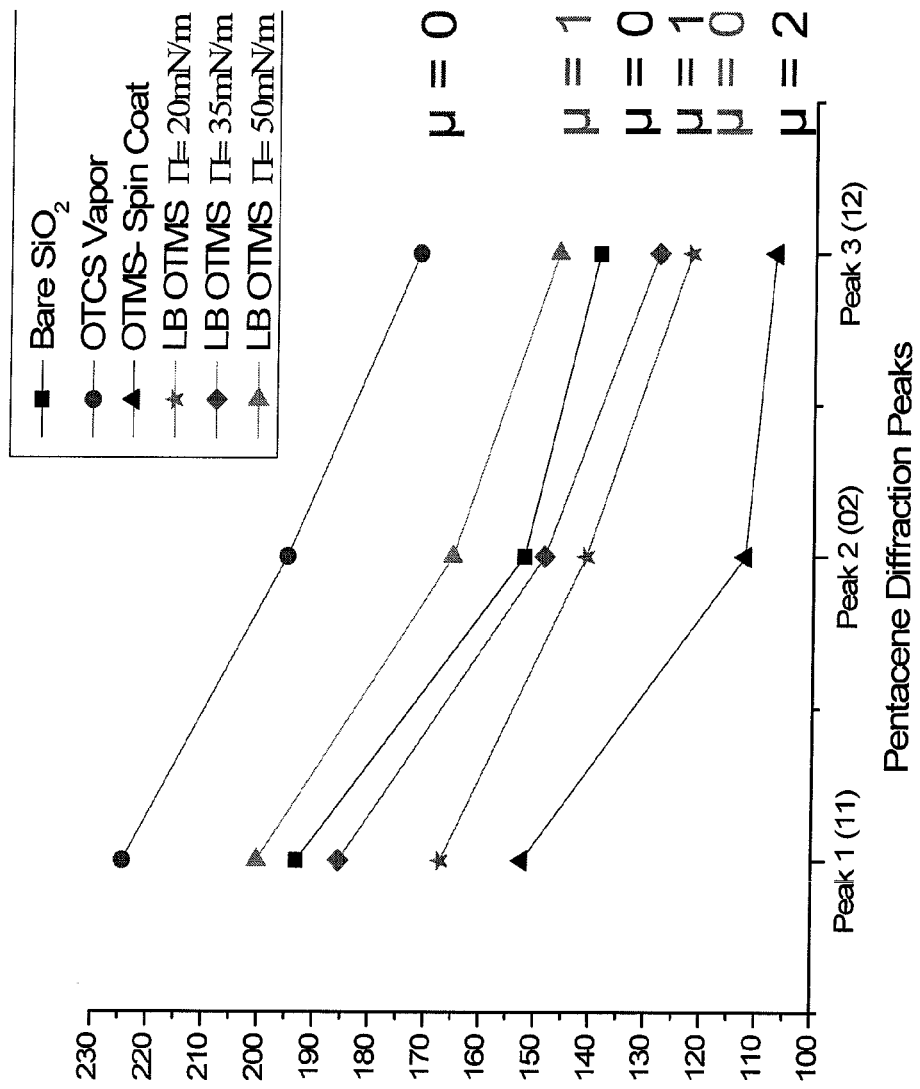
FIG. 4 is a plot of coherence length and mobility, according to various related experimental embodiments.

FIG. 4 plots the coherence length and mobility according to various related embodiments. In connection with this figure, an unexpected result is shown in that the OTCS-CVD gives rise to the relatively largest pentacene crystalline grains, but shows mediocre performance. Pentacene grown on bare $SiO_2$, also shows a high degree of crystallinity compared to many of the other OTS-treated surface despite showing a much lower mobility. There is no general trend between the crystalline perfection (i.e. CL) in the first monolayers of pentacene and mobility.

AFM of the 3 nm pentacene shows a conclusive trend between thin film growth and charge carrier mobility. The growth mode on the highly ordered LB films exhibits desirable two-dimensional (2D) layer-by-layer growth. As discussed above, layer-by-layer 2D growth is desirable since three-dimensional (3D) growth leads to many grain boundaries (which are the major limiting factor for current flow) during coalescence. For certain applications involving the growth of pentacene on $SiO_2$, a first monolayer is grown two-dimensionally, and subsequent growth appears as 3D than on the LB films. As aforementioned, it is the first few monolayers (e.g., 2-6) at the interface where all charge transport occurs, thus 2D growth of the first few monolayers is useful for achieving high mobility. Also, the mobility of pentacene on $SiO_2$ surfaces is generally lower than on OTS treated surfaces due to the presence of interfacial water which can act as trap states.

The growth mode on the OTCS-CVD is the 3D island type. No complete monolayer forms within the first 3 nm of nominal film thickness, though the individual crystalline grains are large (as can be confirmed by GIXD), terraced and have grown several monolayers thick. Whether the semiconductor grows 3D or 2D can within certain limits be controlled via domination by either molecule-molecule interactions or molecule-substrate interactions as described above. For the LB OTMS films, the molecules in the first monolayer of pentacene molecules interact more strongly with the substrate, inducing 2D growth. Moreover, the growth mode proceeds to be more and more 2D as the underlying OTS order increases. For pentacene films on amorphous OTCS-CVD substrates, pentacene-pentacene interlayer interactions dominate, leading to observed 3D growth. Thus, above a certain threshold density of methyl groups (e.g., about 25 $A^2$/Molecule), the interactions between the first pentacene layer and the substrate surface dominate the interactions between two adjacent pentacene layers; moreover the denser the methyl surface, the stronger the interaction. Mobility is also higher on the OTCS-CVD treated surface than on the least compressed LB film (20 mN/m) of this discussion, which reflects the transition between a condition wherein the larger crystallinity of the pentacene on the OTCS-CVD film overcomes the more 2D growth mode on the Langmuir film. Nevertheless, for the Langmuir films with higher surface pressures (35 mN/m and 50 mN/m) the 2D growth mode has more affect upon the resulting structure than the degree of crystalline perfection in pentacene films, at least in terms of mobility.

The various embodiments described above are provided by way of illustration only and should not be construed to limit the invention. Based upon the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention, including that set forth in the following claims.

What is claimed is:

1. A method for manufacturing a semiconductor device having an organic semiconductor material, the method comprising:

on a support layer, forming a continuous monolayer having a density of methyl-terminated molecules that is sufficient to promote two-dimensional crystalline growth of the organic semiconductor material upon the monolayer; and forming the organic semiconductor material on the monolayer.

2. The method of claim 1, wherein forming a monolayer having a density of methyl-terminated molecules that is sufficient to promote two-dimensional crystalline growth of the organic semiconductor material upon the monolayer includes forming a monolayer of methyl-terminated molecules having a density of molecules that exhibit an interaction energy with the organic semiconductor material that is greater than interlayer interaction energy between molecules of the organic semiconductor material.

3. The method of claim 1, wherein
forming the organic semiconductor material includes forming a first layer of organic semiconductor material on the monolayer and a second layer of organic semiconductor material on the first layer, and
forming a monolayer having a density of methyl-terminated molecules that is sufficient to promote two-dimensional crystalline growth of the organic semiconductor material upon the monolayer includes forming a monolayer that exhibits an interaction energy, relative to the first layer, that is greater than interaction energy between the first and second layers.

4. The method of claim 1, wherein forming the organic semiconductor material includes growing two-dimensional layers of organic semiconductor material on the monolayer of methyl-terminated molecules.

5. The method of claim 1, wherein forming a monolayer having a density of methyl-terminated molecules that is sufficient to promote two-dimensional crystalline growth of the organic semiconductor material upon the monolayer includes ordering the methyl-terminated molecules in the monolayer to form a monolayer having said density.

6. The method of claim 1, wherein forming a monolayer having a density of methyl-terminated molecules that is sufficient to promote two-dimensional crystalline growth of the organic semiconductor material upon the monolayer includes forming a monolayer of methyl-terminated molecules having an even number of carbons.

7. The method of claim 1, wherein forming a monolayer having a density of methyl-terminated molecules that is sufficient to promote two-dimensional crystalline growth of the organic semiconductor material upon the monolayer includes forming an organosilane monolayer.

8. The method of claim 1, wherein forming the organic semiconductor material on the monolayer includes at least one of depositing a solution of organic semiconductor material and vapor-depositing organic semiconductor material.

9. The method of claim 1, wherein the support layer is a nonconductive layer.

10. The method of claim 1, wherein the support layer is a composite structure comprising one or more layers.

11. The method of claim 10, wherein the composite structure includes a conductive layer.

12. The method of claim 10, wherein the composite structure includes a nonconductive layer.

13. The method of claim 1, wherein forming the organic semiconductor material on the monolayer includes forming a first layer of organic semiconductor material on the monolayer and a second layer of organic semiconductor material over the first layer, while using interaction energy between the monolayer and the first layer to dominate interactions between the first and second layers to mitigate three-dimensional crystallization of at least one of the first and second layers and to promote two-dimensional growth of the at least one of the first and second layers.

14. The method of claim 1, wherein forming the organic semiconductor material on the monolayer includes forming a first layer of organic semiconductor material on the monolayer and a second layer of organic semiconductor material over the first layer, while using interaction energy between the monolayer and the first layer to dominate interactions between the first and second layers to mitigate three-dimensional crystallization and promote two-dimensional growth of the first layer.

15. A method for manufacturing a semiconductor device having an organic semiconductor material, the method comprising:
on a support layer, forming a monolayer having a density of methyl-terminated molecules that is sufficient to promote two-dimensional crystalline growth of the organic semiconductor material upon the monolayer and therewith including compressing methyl-terminated molecules to form a monolayer of methyl-terminated molecules having said density.

16. A method for manufacturing a semiconductor device having an organic semiconductor material, the method comprising:
on a support layer, forming a monolayer having a density of methyl-terminated molecules that is sufficient to promote two-dimensional crystalline growth of the organic semiconductor material upon the monolayer and therewith including forming a self-assembled monolayer.

17. A method for manufacturing a semiconductor device having an organic semiconductor material, the method comprising:
on a support layer, forming a monolayer having a density of methyl-terminated molecules that is sufficient to promote two-dimensional crystalline growth of the organic semiconductor material upon the monolayer and therewith including forming a monolayer having a molecular layer density of methyl-terminated molecules that is at least about one molecule per 25 square Angstroms.

18. A method for manufacturing a semiconductor device having an organic semiconductor material, the method comprising:
on a support layer, forming a monolayer having a density of methyl-terminated molecules that is sufficient to promote two-dimensional crystalline growth of the organic semiconductor material upon the monolayer and therewith including forming a monolayer having phase characteristics that are predominantly crystalline.

19. A method for manufacturing a semiconductor device having an organic semiconductor material, the method comprising:
on a dielectric layer, forming a self-assembled monolayer (SAM) having a density of methyl-terminated molecules that is sufficient to dominate inter-layer interactions between layers of organic semiconductor material formed thereupon; and
on the SAM, forming layers of organic semiconductor material using interaction energy between the methyl-terminated molecules and a first one of the layers to dominate inter-layer interactions between the first one and another one of the layers for controlling the formation of at least the first one of the layers as a two-dimensional layer.

20. The method of claim 19, wherein using the interaction energy between the methyl-terminated molecules and a first one of the layers to dominate inter-layer interactions between the first one and another one of the layers for controlling the formation of at least the first one of the layers as a two-dimensional layer includes controlling the formation of at least two of the layers as two-dimensional layers.

21. The method of claim 19, wherein forming a SAM includes forming a SAM of methyl-terminated molecules having an even number of carbons.

22. A method for manufacturing a semiconductor device having an organic semiconductor material including at least two layers, the method comprising:
selecting a density and compression of a monolayer of the methyl-terminated molecules to effect an interaction energy between the monolayer and a layer of the organic semiconductor material that is greater than an interaction energy between the at least two layers of the organic semiconductor material;

on a support layer, forming a monolayer of the methyl-terminated molecules at the selected density by depositing and compressing the methyl-terminated molecules;

forming a first layer of organic semiconductor material on the monolayer; and forming a second layer of organic semiconductor material on the first layer, using the interaction energy between the monolayer and the first layer to dominate interactions between the first and second layers and mitigate three-dimensional crystallization of at least one of the at least two layers to promote two-dimensional growth of the at least one of the layers.

23. A method for manufacturing a semiconductor device having an organic semiconductor material, the method comprising:

on a support layer, forming a monolayer having a density of methyl-terminated molecules that is sufficient to promote two-dimensional crystalline growth of the organic semiconductor material upon the monolayer and therewith including forming a monolayer extending in a lateral direction along the support layer, the length of the monolayer along the lateral direction being an order of magnitude greater than the thickness of the monolayer, and forming the organic semiconductor material on the monolayer and therewith including growing the organic semiconductor material via two-dimensional crystallization in a lateral direction along an underlying surface of the monolayer, the monolayer separating the organic semiconductor material from the support layer.

* * * * *